United States Patent [19]

Myer

[11] Patent Number: 5,252,934
[45] Date of Patent: Oct. 12, 1993

[54] MICROWAVE DELAY ASSEMBLY

[75] Inventor: Robert E. Myer, Denville, N.J.

[73] Assignee: AT&T Bell Laboratoris, Murray Hill, N.J.

[21] Appl. No.: 935,493

[22] Filed: Aug. 25, 1992

[51] Int. Cl.⁵ .......................... H01P 1/18; H01P 9/04
[52] U.S. Cl. .................................. 333/156; 333/109; 333/203; 330/151
[58] Field of Search ..................... 333/109, 28 R, 156, 333/203, 160; 330/149, 151

[56] References Cited

U.S. PATENT DOCUMENTS

| | | | |
|---|---|---|---|
| 4,197,514 | 4/1980 | Kasuga et al. | 333/109 X |
| 4,218,664 | 8/1980 | Assal et al. | 333/203 X |
| 4,517,521 | 5/1985 | Preschutti et al. | 330/151 X |
| 5,001,443 | 3/1991 | Martin, III | 333/125 X |
| 5,032,798 | 7/1991 | Myer | 333/137 X |

*Primary Examiner*—Robert J. Pascal
*Assistant Examiner*—Seung Ham
*Attorney, Agent, or Firm*—Alfred G. Steinmetz

[57] ABSTRACT

A signal delay assembly for a high power linear amplifier, using feedforward circuitry to reduce distortion, comprises an interdigital delay line unit with included directional couplers. The structure of the interdigital delay line is substantially in a parallelepiped housing. A co-axial connector constructed as an integral part of the delay unit is used for signal connection to the amplifier.

5 Claims, 5 Drawing Sheets

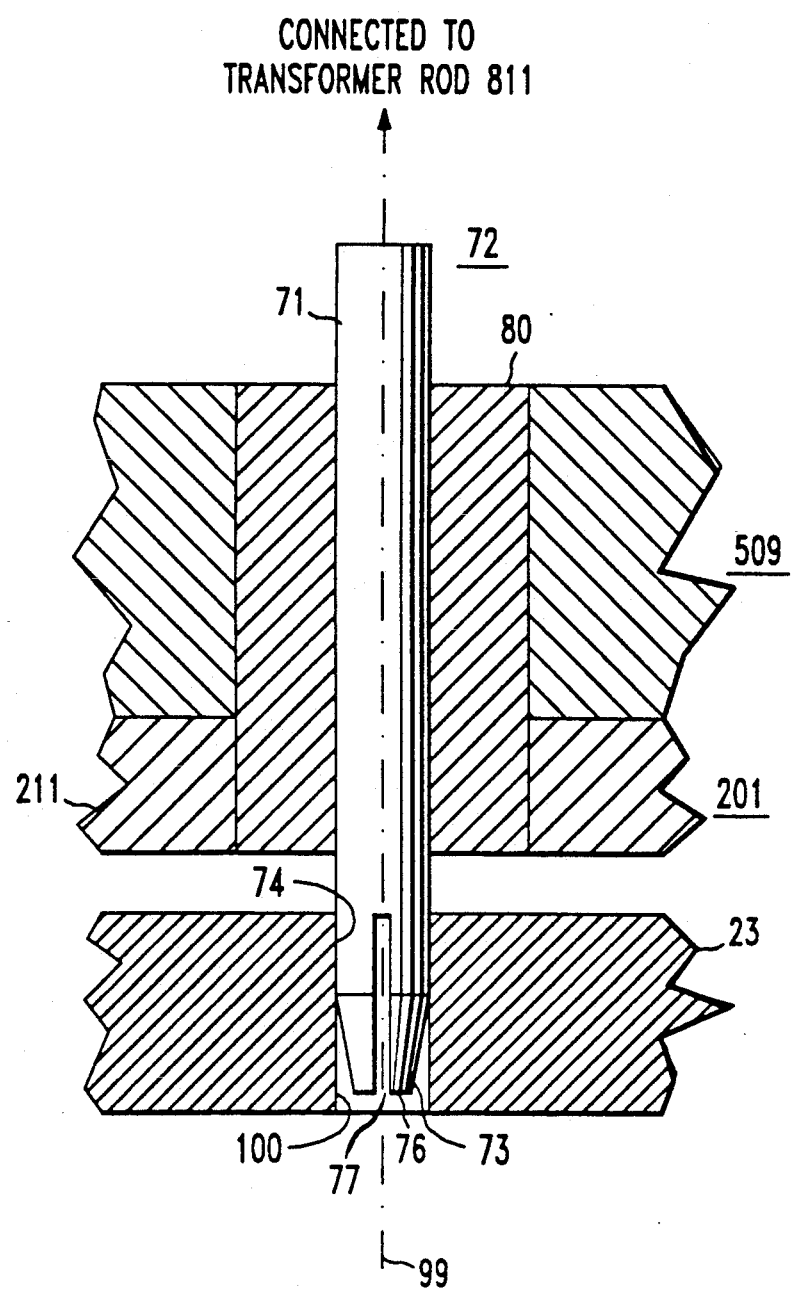

MICROWAVE DELAY ASSEMBLY

FIELD OF THE INVENTION

This invention relates to a microwave delay line assembly and in particular to a delay line structure using interdigital or other resonating rod type filter construction.

BACKGROUND OF THE INVENTION

Signal delay at microwave frequencies is normally achieved by the use of co-axial cable or some other form of a transmission line. This arrangement provides for signal delay over a broad band of frequencies. In many applications however a delay is required for a signal within a narrow band of frequency. An example is a wireless communication apparatus in which the information signal is within a narrow frequency band. With a narrowband signal to consider other elements such as filters may be used for signal delay.

SUMMARY OF THE INVENTION

An illustrative signal delay assembly, embodying the principles of the invention, for use in a high power linear amplifier, having feedforward circuitry to reduce distortion, comprises an interdigital delay line unit with included directional couplers. The structure of the interdigital delay line is included in a substantially parallelepiped housing. A co-axial connector is constructed as an integral part of the delay unit and is used for signal input.

A feature of an illustrative embodiment of the structure is a subsidiary structural projection at one end and at a right angle to the longitudinal axis of the parallelepiped structure and including a resonating rod to allow structural retrofitting of the delay unit into the existing dimensions of attachments of existing amplifier systems with a feedforward circuitry designed for using a transmission delay line.

BRIEF DESCRIPTION OF THE DRAWING

In the Drawing:

FIG. 10 is cross section of a microwave coupling device such as disclosed in U.S. Pat. No. 5,001,443 and used as a coupler.

DETAILED DESCRIPTION

Figure 1:
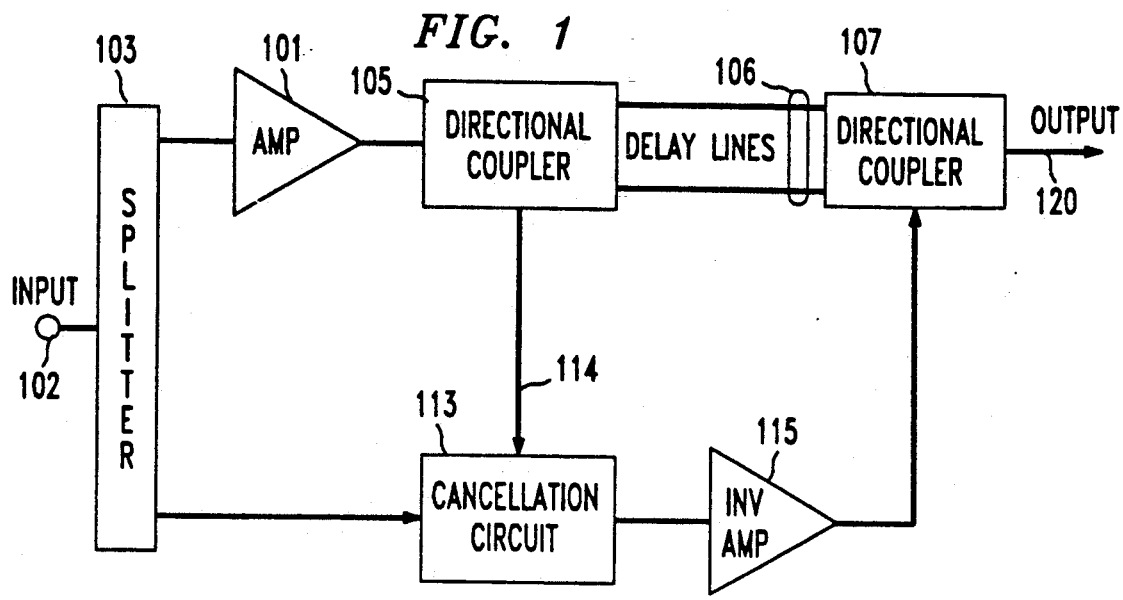
FIG. 1 is a block schematic of an amplifier with a feedforward system.

An amplifier 101 having an associated feedforward system is shown schematically in the FIG. 1. Input signals are applied to input terminal 102 and are divided into two paths by a signal splitter circuit 103. One path includes the amplifier 101 whose output is applied to a directional coupler 105 which has an output connected to an input of a delay line 106.

The second output of splitter circuit 103 is directed to the input 112 of a cancellation circuit 113. The directional coupler 105 splits the output of the amplifier 101 and supplies a portion of this output to the input 114 of the cancellation circuit 113.

The cancellation circuit 113 is operative to subtract the input signal applied to amplifier 101 from its output signal. This leaves the distortion products introduced by the amplifier 101 into the signal. These distortion products are inverted by an amplifier 115 and are recombined with the output of the amplifier 101 through the directional coupler 107.

The time delay of the delay line 106 is selected to compensate for signal delays occasioned by the cancellation circuit 113 and amplifier 115. Accordingly, the output signal at terminal 120 has a substantial portion of its distortion removed.

Typically a co-axial transmission line has been used as the delay line. A typical physical arrangement is shown in the FIG. 2. A plurality of linear amplifiers 101, which are electrically connected in parallel are arranged in a circular array 201. This array is a standard physical layout for the paralleled amplifiers and is described in U.S. Pat. No. 5,032,798 issued Jul. 16, 1991 to R. E. Myer. The delay line 106 is connected to a common output of the amplifier array 201. It is coiled as shown to limit the physical space it occupies. While 1½ turns of the transmission delay line are illustratively shown, a usable physical embodiment often uses up to 3½ turns.

An input directional coupler 105 and output directions coupler 107 are coupled to opposite sides of the delay line respectively. These are used for connecting to the amplifier 201 and to an output circuit, respectively.

Figure 2:
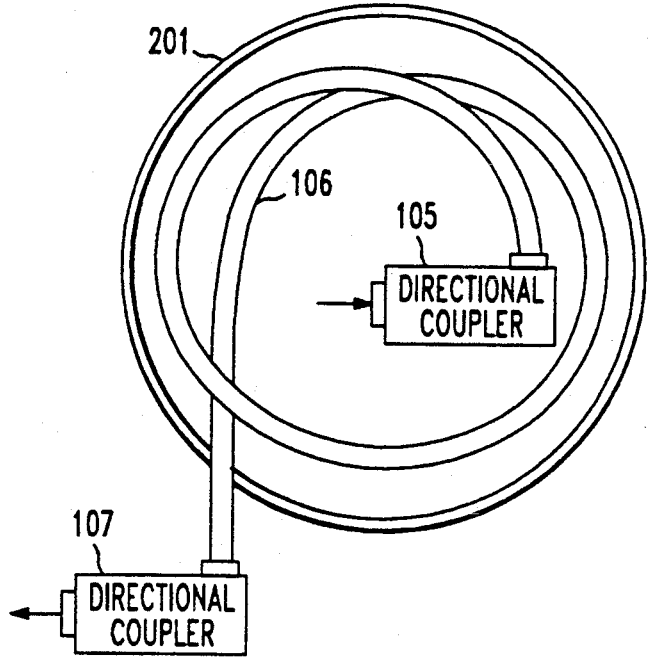
FIG. 2 is a pictorial schematic of a typical delay line arrangement used in prior art amplifiers with feedforward systems.
Figure 3:
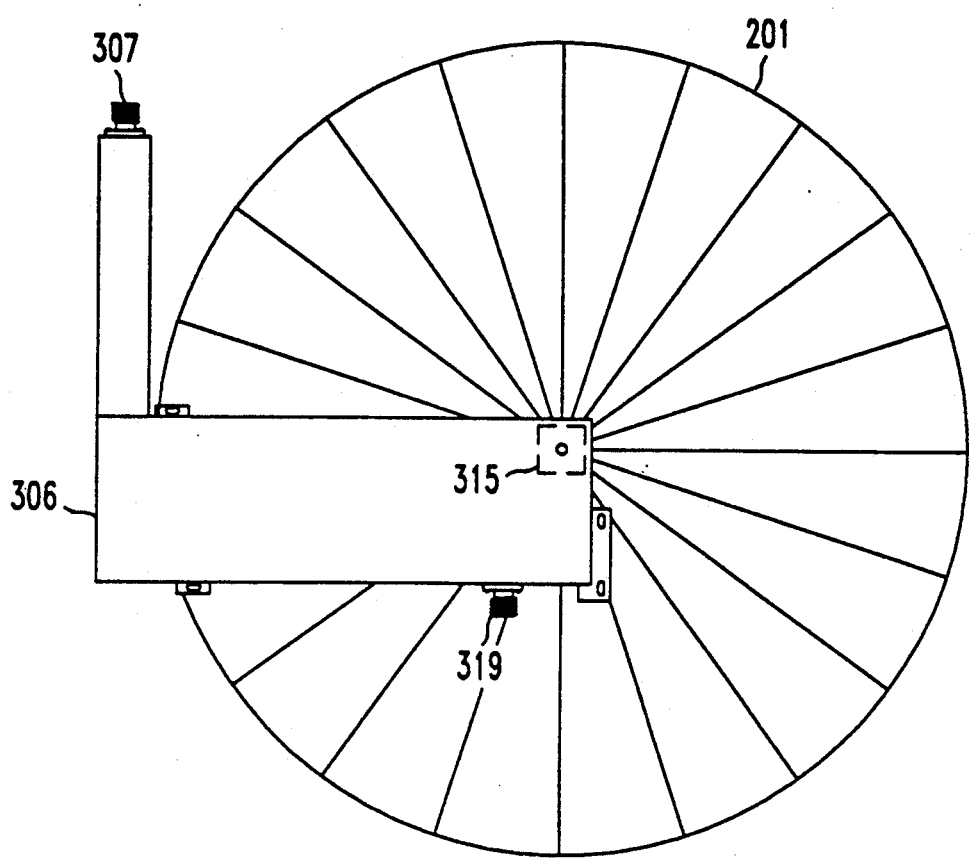
FIG. 3 is a frontal view pictorial schematic of a signal delay assembly according to the invention replacing the delay line arrangement of FIG. 2.
Figure 4:
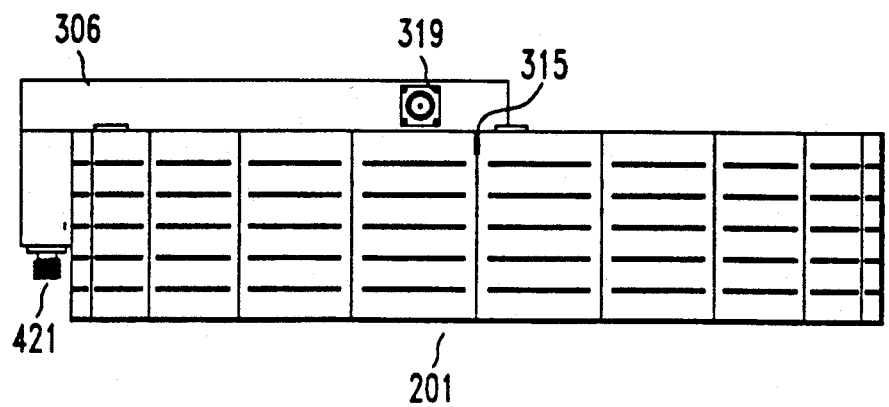
FIG. 4 is a side view pictorial schematic of a signal delay assembly according to the invention replacing the delay line arrangement of FIG. 2.

An illustrative microwave interdigital delay assembly 306 for replacing the delay line 106 of FIG. 2 is shown in the FIGS. 3 and 4. Its input connector 315 (shown by a dotted line outline of a connector on the reverse side of the delay assembly) and its output connector 317 are each physically located to correspond to the attachment positions of the input and output connectors of the delay line couplers 105 and 107, as shown in FIG. 2, in order to facilitate retrofitting of the interdigital delay assemblies into amplifier systems presently using the co-axial delay lines. The input connector 315 is provided to directly mate with a receptacle (whose location is shown by the heavy line 315 in FIG. 4) provided by the circular amplifier array 201. Directional couplers 319 and 421 are provided to interface with the feedforward circuitry of the amplifier system. Directional coupler connector 319 is visible in the views of FIGS. 3 and 4 and the directional coupler 421 is shown in FIG. 4.

Figure 5:
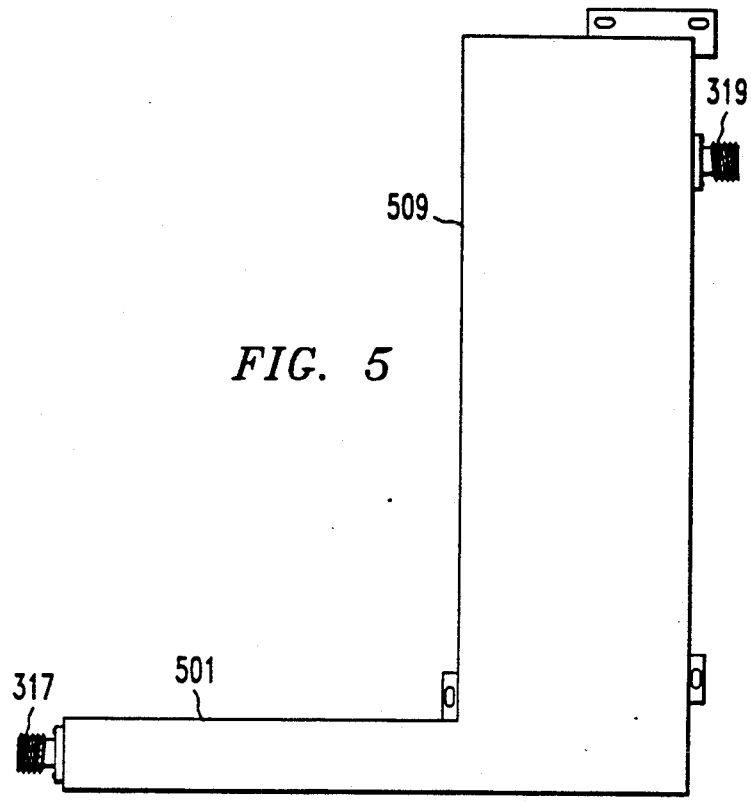
FIGS. 5, 6 and 7 are elevation, plan and side views of the signal delay assembly of FIGS. 3 and 4.
Figure 7:
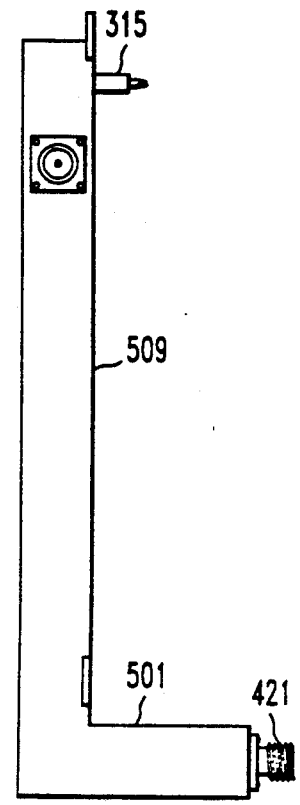
Figure 6:
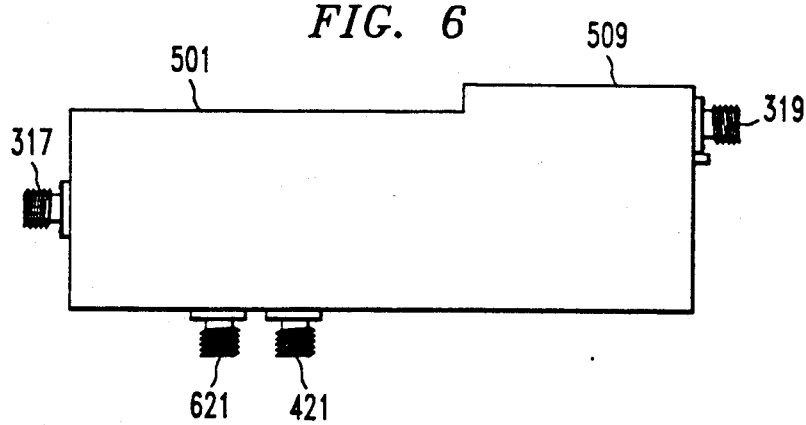

Three orthogonal views of the delay assembly are shown in the FIGS. 5, 6 and 7. The plan view of FIG. 5 shows a main parallelepiped housing member 509 of conductive material having an extension member 501 at one end of the housing to provide dimensional conformance with existing connections for the transmission delay line assembly it is intended to replace. A plan view of the assembly looking from the bottom upward is shown in the FIG. 6 and a side view is shown in the FIG. 7. An input connector 315 is provided to connect with a receptacle in an amplifier module and an output connector 317 is provided to join with a receptacle in the output 120 of amplifier system. The output connector 317 is provided in the extension member 501. Two directional coupler connectors 421 and 621 are included in the extension member. Only one of the directional coupler connectors 421 or 621 is used at one time. The two couplers are designed to provide different dB drops in connecting with the delay assembly. A directional coupler connector 319 is included in the main housing member 509.

Figure 8:
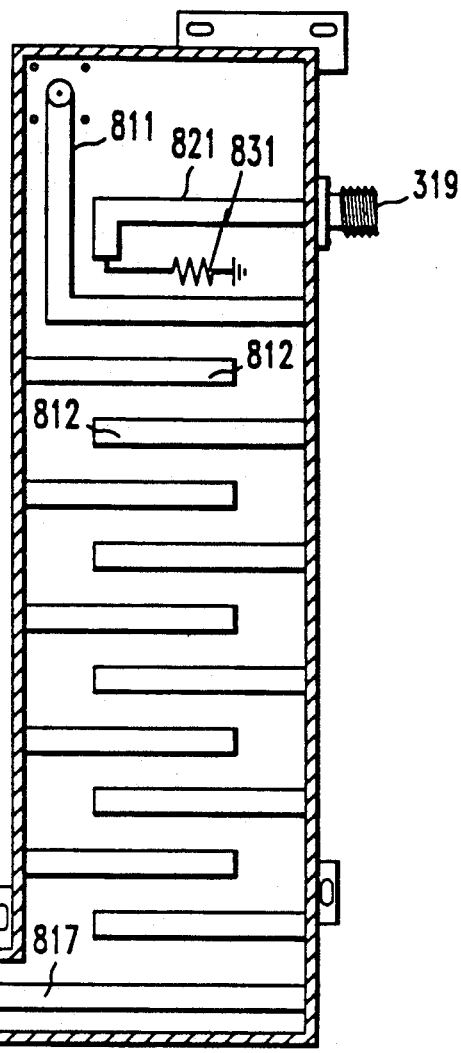
FIGS. 8 and 9 are cross sectional views of the elevation and plan views of the signal delay assembly of FIGS. 5 and 6, respectively.
Figure 9:
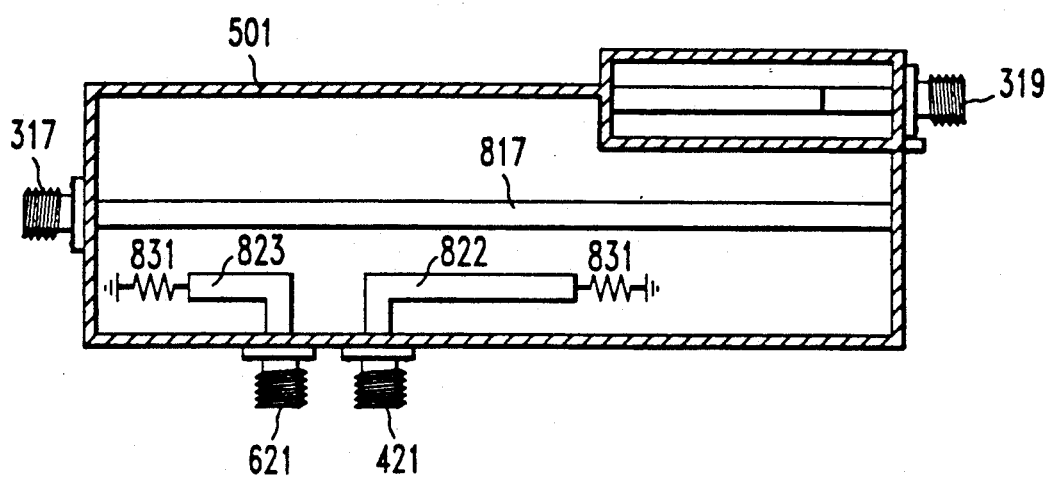

A cross section of the interdigital delay assembly of FIGS. 5 and 6 is shown in the FIGS. 8 and 9, respectively. The interdigital delay assembly comprises an input L-shaped transformer rod 811 a plurality of interdigitized resonators 812 and an output transformer rod 817, located in the extension member 501. These rods and resonators are housed and attached to a conductive housing comprising housing 509 and the extension 501 forming the overall structure of the delay assembly. The resonator rods 812 are tuned so that the chamber defined by the conductive housing 509 has the desired delay line properties within the narrow operative frequency band of the amplifier.

The input coupler 315, coupled to the transformer rod 811, is connected to receive direct input from the amplifier array 201 and apply it to the delay assembly. The output of signals delayed by the resonators is taken from the output coupler 317 which is connected to the transformer rod 817. Added directional conductive line coupling rods 821, 822 and 823 are provided to allow the delay assembly to interact with the feedforward circuitry of the amplifier assembly of FIG. 1. The directional coupler conductive line rod 821 is positioned to interact electrically with transformer rod 811 at a predetermined dB level. Rod 821 is connected to the coupler fitting 319 and provides output to the cancellation circuit 113 (shown in FIG. 1). Two directional conductive line coupler rods 822 and 823 are provided to electrically interact with transformer rod 817 at different dB levels. Access is provided to these rods by the coupling fittings 421 and 621. Only one of these fittings is connected to receive the output of amplifier 115 at any one time. Each of the conductive line rods 821, 822 and 823, for providing directional coupling, is terminated in a characteristic impedance 831 of the delay assembly.

The amplifier output applied to the coupling fitting is picked up by directional coupler rod 821 and is connected, via fitting 319, to the cancellation circuit 113 shown in the FIG. 1. The directional coupler rod 822 is connected to receive the output of the inverter amplifier 115 shown in FIG. 1, where the output signal is superimposed on the delayed output of coupling fitting 317.

The coupling device 315, used herein in the illustrative embodiment, is of a type disclosed in U.S. Pat. No. 5,001,443. The disclosure of this patent is incorporated herein by reference. This coupling device is shown in the FIG. 10. The coupling device is mounted in a dielectric support sleeve 80 in a wall 211 of the housing 509 of the delay assembly. It is positioned so that the coupler may be connected to the proximate transformer rod by an inner end 71 of a conductor pin 72 which is on the axis 99. The coupler device includes a forward tapered pin portion 73 of the inner conductor 72 which engages an opening 100 in a receptacle 23 within and behind a wall of the amplifier array 201. The pin 72 has formed within the forward portion a pair of diametrical slots (a slot 77 is shown and a perpendicular slot is not shown) extending vertically upward in the pin from its front face 76 and stem 74. The slots cause the pin to be radially resilient and so that the pin effectively engages the opening 100. The central inner conductor 71 is held in place by the dielectric sleeve 80 and the inner conductor 71 extends sufficiently to be connected to the transformer rod 811, shown in FIG. 5. This assemblage forms a co-axial waveguide connector capable of coupling electrical energy into and out of the delay assembly shown in the views of FIGS. 5, 6 and 7.

While a particular illustrative construction of the delay assembly has been disclosed, it is readily apparent that many variations of the illustrative arrangement may be devised by those skilled in the art without departing from the spirit and scope of the invention. Such variations may include comb like resonating filter constructions.

I claim:

1. In an amplifier system including a feedforward system incorporating a signal delay line;
    a delay line assembly, comprising:
    a housing member constructed of conductive metallic material forming an enclosed microwave cavity;
    a plurality of resonator rods affixed to sidewalls of the housing member, the plurality of resonator rods extending along a longitudinal dimension of the housing and being dimensioned in separation between rods and rod dimensions to be operative as a signal delay within a defined band of signal frequency;
    first and second transformer rods located at opposite ends of the housing member;
    an input co-axial connector mounted at a first end of the housing member and electrically connected to the first transformer rod;
    a first directional coupler mounted at the first end of the housing member including a first conductive line proximate to and electrically interactive with the first transformer rod for extracting electrical signals supplied at the input at the input co-axial connector at a specified dB level from the first transformer rod, and a first directional co-axial connector connected to the first conductive line for connecting to electrical apparatus external to the housing member;
    an output co-axial connector mounted at a second end of the housing member and electrically connected to the second transformer rod;
    a second directional coupler mounted at a second end of the housing member substantially opposite the first end and including a second directional co-axial connector for connecting to electrical apparatus external to the housing member and a second conductive line internal to the housing member connected to the second directional co-axial connector and the second conductive line positioned to be electrically interactive at a specified dB level with the second transformer rod for superimposing electrical signals onto the second transformer rod, and in turn supplying it to the output connector.

2. In an amplifier system including a feedforward system incorporating a signal delay line; as claimed in claim 1:
    the housing member is provided with an extension at one end including the second transformer rod being greater in length than the first transformer rod and displacing the output connector laterally from a longitudinal axis of the for a distance greater than the distance of the input connector from the longitudinal axis.

3. In an amplifier system including a feedforward system incorporating a signal delay line; as claimed in claim 1:
    further including a third directional coupler including a a third conductive line interacting interactively with the second transformer rod at a dB level different from a db level between the second transformer rod and the second conductive line.

4. In an amplifier system including a feedforward system incorporating a signal delay line; as claimed in claim 1:
    wherein the input coaxial connector includes a pin conductor for engaging a receptacle in a the amplifier system supplying a plurality of narrowband signals to be delayed.

5. In an amplifier system including a feedforward system incorporating a signal delay line; as claimed in claim 1:
    wherein the plurality of resonator rods are interdigitized being alternately affixed to opposing sidewalls of the housing member.

* * * * *